(12) United States Patent
Jia et al.

(10) Patent No.: US 11,328,940 B2
(45) Date of Patent: May 10, 2022

(54) DEGASSING CHAMBER AND SEMICONDUCTOR PROCESSING APPARATUS

(71) Applicant: BEIJING NAURA MICROELECTRONICS EQUIPMENT CO., LTD., Beijing (CN)

(72) Inventors: Qiang Jia, Beijing (CN); Peijun Ding, Beijing (CN); Mengxin Zhao, Beijing (CN); Hougong Wang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 536 days.

(21) Appl. No.: 16/364,985

(22) Filed: Mar. 26, 2019

(65) Prior Publication Data

US 2019/0221454 A1 Jul. 18, 2019

Related U.S. Application Data

(63) Continuation of application No. PCT/CN2017/073057, filed on Feb. 7, 2017.

(30) Foreign Application Priority Data

Sep. 27, 2016 (CN) .......................... 201610854013.4

(51) Int. Cl.
*H05B 3/00* (2006.01)
*H01L 21/67* (2006.01)
(Continued)

(52) U.S. Cl.
CPC ...... *H01L 21/67098* (2013.01); *C23C 14/228* (2013.01); *H01L 21/324* (2013.01);
(Continued)

(58) Field of Classification Search
CPC ............ H05B 3/0047; H01L 21/67757; H01L 21/67109; H01L 21/67248; H01L 21/67;
(Continued)

(56) References Cited

U.S. PATENT DOCUMENTS 5,380,682 A * 1/1995 Edwards ............... G01J 5/0003
438/800
6,497,734 B1 * 12/2002 Barber .............. H01L 21/67017
29/25.01
(Continued)

FOREIGN PATENT DOCUMENTS

| CN | 103572211 A | 2/2014 |
|----|----|----|
| CN | 105441899 A | 3/2016 |
| CN | 105655234 A | 6/2016 |
| CN | 105789084 A | 7/2016 |
| JP | 2007201348 A | 8/2007 |
| JP | 2011138828 A | 7/2011 |

(Continued)

OTHER PUBLICATIONS

The World Intellectual Property Organization (WIPO) International Search Report for PCT/CN2017/073057 dated Jun. 13, 2017 6 Pages (including translation).

*Primary Examiner* — Gregory A Wilson
(74) *Attorney, Agent, or Firm* — Anova Law Group, PLLC (57) ABSTRACT

A degassing chamber and a semiconductor processing apparatus are provided. The degassing chamber includes a chamber; a substrate container, movable within the chamber in a vertical direction; and a heating component, disposed within the chamber. A substrate transferring opening is formed through a sidewall of the chamber for transferring substrates into or out of the chamber. The heating component includes a first light source component and a second light source component. The chamber is divided into a first chamber and a second chamber by the substrate transferring opening. The first light source component is located in the first chamber, and the second light source component is located in the second chamber. The first light source component and the (Continued)

second light source component are provided for heating a substrate in the substrate container.

16 Claims, 4 Drawing Sheets

(51) Int. Cl.
*H01L 21/324* (2006.01)
*C23C 14/22* (2006.01)

(52) U.S. Cl.
CPC .... *H01L 21/6719* (2013.01); *H01L 21/67115* (2013.01); *C23C 14/22* (2013.01)

(58) Field of Classification Search
CPC ....... H01L 21/324; C23C 14/23; C23C 14/50; C23C 14/541
See application file for complete search history.

(56) References Cited

U.S. PATENT DOCUMENTS

| | | | |
|---|---|---|---|
| 6,767,176 B2 | 7/2004 | Yudovsky et al. | |
| 9,728,432 B2 * | 8/2017 | Burgess | ............ H01L 21/67017 |

FOREIGN PATENT DOCUMENTS

| | | |
|---|---|---|
| JP | 2016105479 A | 6/2016 |
| KR | 20020053183 A | 7/2002 |
| KR | 20120102085 A | 9/2012 |
| TW | 424265 B | 3/2001 |
| TW | 200811958 A | 3/2008 |
| TW | 201443998 A | 11/2014 |
| TW | 201543600 A | 11/2015 |
| TW | 201623662 A | 7/2016 |
| TW | I550146 B | 9/2016 |
| WO | 2016095259 A1 | 6/2016 |

* cited by examiner

DEGASSING CHAMBER AND SEMICONDUCTOR PROCESSING APPARATUS

CROSS-REFERENCES TO RELATED APPLICATIONS

This application is a continuation application claims priority of International Application No. PCT/CN2017/073057, filed on Feb. 7, 2017, which claims priority to Chinese Patent Application No. 201610854013.4, filed on Sep. 27, 2016, the entire content of all of which is hereby incorporated by their reference.

FIELD OF THE DISCLOSURE

The present disclosure generally relates to the field of semiconductor manufacturing technologies and, more particularly, relates to a degassing chamber and a semiconductor processing apparatus.

BACKGROUND

Figure 1:
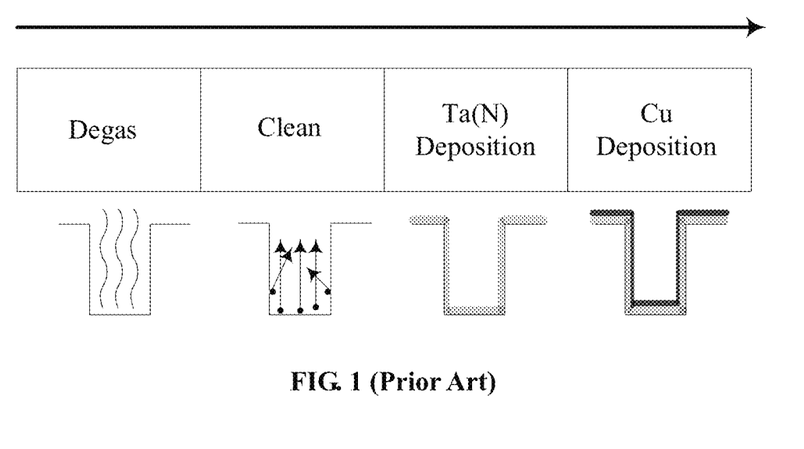
FIG. 1 is a flowchart of a copper interconnect physical vapor deposition (PVD) process.

Physical vapor deposition (PVD) is widely used in semiconductor manufacturing processes. In a PVD process, a degas step is usually required to remove impurities, such as water vapor and the like adsorbed by the substrate from the atmosphere, to clean the surface of the substrate, and to provide a substrate as clean as possible for subsequent processes. For example, a PVD process for copper interconnect shown in FIG. 1 includes a degas step.

Figure 2:
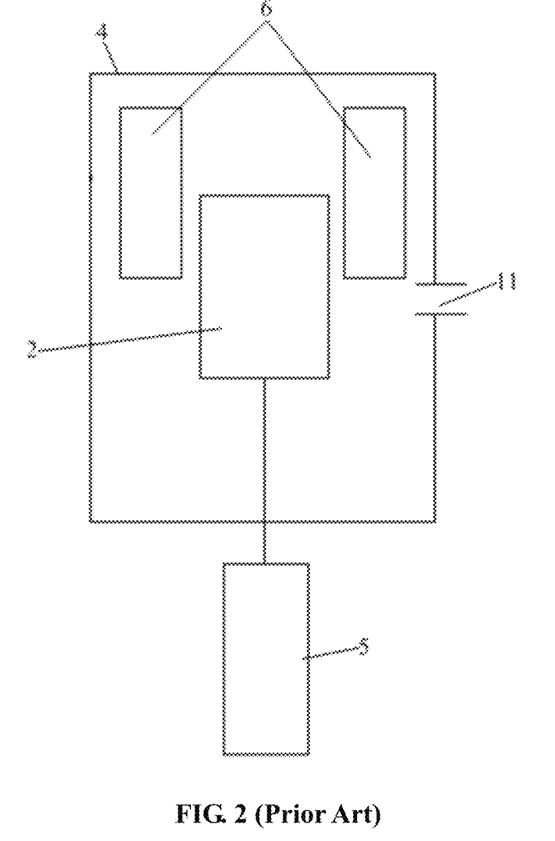
FIG. 2 is a cross-sectional view of a degassing heating system.

Generally, the degas step is implemented by a degassing heating system. For example, FIG. 2 illustrates a conventional degassing heating system which mainly includes a vacuum chamber 4, a substrate container 2, a lifting system 5, and a light source 6. The vacuum chamber 4 provides a process environment, and has a substrate transferring opening 11 in its sidewall for transferring substrates into or out of the vacuum chamber 4. The substrate container 2 is provided for carrying multiple substrates. The lifting system 5 is provided for driving the substrate container 2 up and down to transfer the substrates placed in different height positions in the substrate container 2 to a height position corresponding to the substrate transferring opening 11 for transferring substrates; and the light source 6 is provided for supplying heat.

The operational process of the above degassing heating system is as follows: 1) a batch of substrates is transferred into the vacuum chamber 4 through the substrate transferring opening 11, and the substrates are placed at different height positions in the substrate container 2 by lifting of the lifting system 5; 2) the substrate container 2 is moved by the lifting system 5 to a degassing process position near the light source 6; 3) the light source 6 is turned on, the substrates are heated to perform a degassing operation; 4) the light source 6 is turned off, the lifting system 5 drives the substrate container 2 moved to the height position corresponding to the substrate transferring opening 11, and some substrates, as desired, are taken away by a manipulator from the vacuum chamber 4; 5) more substrates are replenished to the substrate container 2; and 6) steps 1) to 5) are repeated until all the substrates to be degassed are completed for the degassing process.

In the actual degassing process, since the substrate transferring opening 11 is located below the light source 6, each time when a substrate is transferred, the substrate container 2 needs to be moved downward from the position corresponding to the light source 6 to the position corresponding to the substrate transferring opening 11. Thus, the substrate container 2 is deviated from the position corresponding to the light source 6, resulting in a temperature drop of the substrate container 2 along with the substrates contained therein. The temperature drop of the substrate is uncontrollable. As not all of the substrates in the substrate container 2 are taken out at a same moving-down of the substrate container 2, the temperature at which each substrate is taken out of the substrate container 2 is not a controllable ideal temperature and the temperature is also inconsistent, which affects the consistency and stability of subsequent process results.

BRIEF SUMMARY OF THE DISCLOSURE

One aspect of the present disclosure provides a degassing chamber, including a chamber; a substrate container, movable within the chamber in a vertical direction; and a heating component, disposed within the chamber. A substrate transferring opening is formed through a sidewall of the chamber for transferring substrates into or out of the chamber. The heating component includes a first light source component and a second light source component. The chamber is divided into a first chamber and a second chamber by the substrate transferring opening. The first light source component is located in the first chamber, and the second light source component is located in the second chamber. The first light source component and the second light source component are provided for heating a substrate in the substrate container.

Another aspect of the present disclosure provides a semiconductor processing apparatus. The semiconductor processing apparatus includes a degassing chamber. The degassing chamber includes a chamber; a substrate container, movable within the chamber in a vertical direction; and a heating component, disposed within the chamber. A substrate transferring opening is formed through a sidewall of the chamber for transferring substrates into or out of the chamber. The heating component includes a first light source component and a second light source component. The chamber is divided into a first chamber and a second chamber by the substrate transferring opening. The first light source component is located in the first chamber, and the second light source component is located in the second chamber. The first light source component and the second light source component are provided for heating a substrate in the substrate container.

Other aspects or embodiments of the present disclosure can be understood by professionals skilled in the art in light of the description, the claims, and the drawings of the present disclosure.

BRIEF DESCRIPTION OF THE DRAWINGS

The following drawings are merely for illustrative purposes according to various embodiments and are not intended to limit the scope of the present disclosure.

DETAILED DESCRIPTION

In order to enable those skilled in the art to better understand the technical solutions of the present disclosure, a degassing chamber and a semiconductor processing apparatus provided by the present disclosure are further described in detail below in conjunction with the accompanying drawings and specific embodiments.

The present disclosure provides a degassing chamber and a semiconductor processing apparatus containing a degassing chamber. An exemplary degassing chamber enables a substrate in the substrate container to be heated by light sources in an upper region and/or in a lower region of a substrate transferring opening, thereby ensuring a uniform process temperature in a degassing process and a transferring process.

Figure 3:
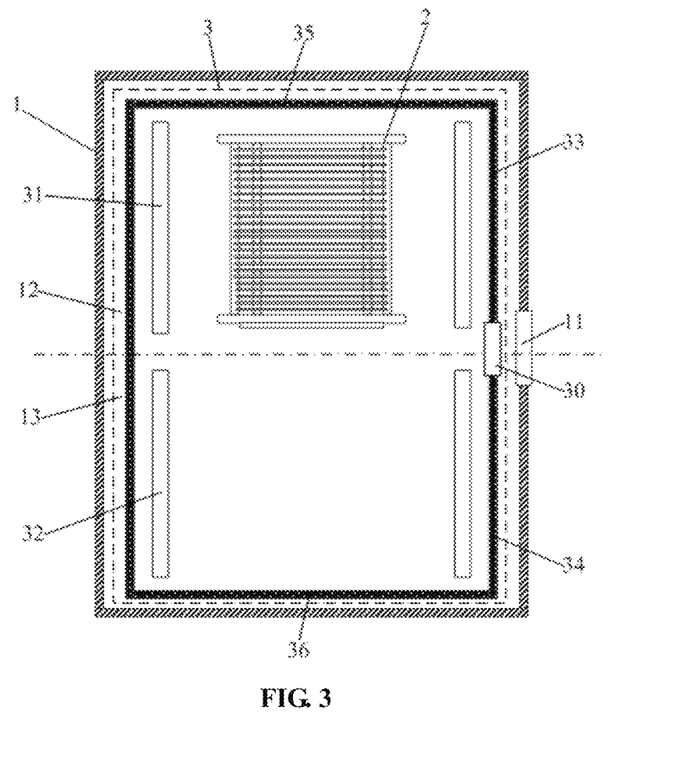
FIG. 3 is a structural diagram of a degassing chamber according to some embodiments of the present disclosure.

FIG. 3 illustrates an exemplary degassing chamber according to some embodiments of the present disclosure. As shown in FIG. 3, the degassing chamber includes a chamber 1 and a substrate container 2. A substrate transferring opening 11 for transferring substrates into or out of the chamber 1 is provided at a sidewall of the chamber 1. The substrate container 2 may be moved in a vertical direction within the chamber 1, for example. The degassing chamber further includes a heating component 3 disposed within the chamber 1. The heating component 3 includes a first light source component 31 and a second light source component 32. The substrate transferring opening 11 serves as a boundary to divide the chamber 1 into a first chamber 12 and a second chamber 13. The first light source component 31 is located in the first chamber 12, and the second light source component 32 is located in the second chamber 13. The first light source component 31 and the second light source component 32 are provided for heating a substrate in the substrate container 2. Thus, the substrate in the substrate container 2 can be heated by light sources in the upper region and/or in the lower region of the substrate transferring opening 11, thereby ensuring a uniform process temperature of the substrates during a degassing process and a transferring process. In addition, not only the quality of the substrate degassing process is improved, but also cleaner substrates for the subsequent process are provided.

The first light source component 31 is disposed around the first chamber 12 on the inner sidewall of the first chamber 12 in the circumferential direction of the first chamber 12. The second light source component 32 is disposed around the second chamber 13 on the inner sidewall of the second chamber 13 in the circumferential direction of the second chamber 13. For example, the first light source component 31 and the second light source component 32 are disposed along the vertical direction in the chamber 1 and are symmetrically disposed with respect to the substrate transferring opening 11. The substrate container 2 may be vertically moved up and down in a space surrounded by the first light source component 31 and the second light source component 32, which enables a substrate in the substrate container 2 to be evenly heated by the first light source component 31 or the second light source component 32 no matter what position in the chamber 1 that the substrate container moves to. Thus, when the substrate needs to be moved into or out of the chamber 1, even if the position of substrate container 2 in the first chamber 12 and the second chamber 13 is changed, the substrate in the substrate container 2 may be heated by the first light source 31 and/or the second light source 32.

Since the first light source component 31 or the second light source component 32 surrounds the substrate container 2 in the chamber 1 to form heating spaces, each of the first light source component 31 and the second light source component 32 can uniformly heat the substrate in the substrate container 2. The temperature uniformity of the substrate in the substrate container 2 can thus be improved. In practical applications, the first light source component or the second light source component may also adopt any other structure as long as the first light source component or the second light source component can heat the substrate in the substrate container.

Figure 4:
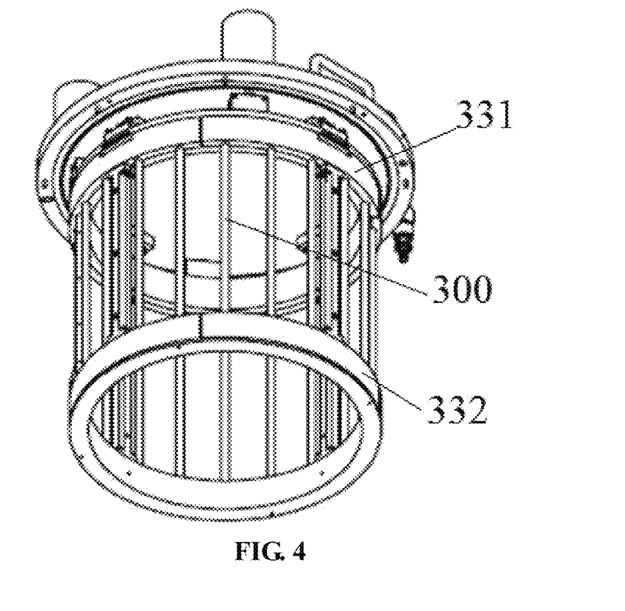
FIG. 4 is a structural diagram of a first light source component in FIG. 3 according to some embodiments of the present disclosure.

In one embodiment, as shown in FIG. 4, the first light source component 31 includes a plurality of first line-light-sources 300. The length direction of each first line-light-source 300 is along the moving direction of the substrate container 2. The plurality of first line-light-sources 300 are parallel to each other and arranged along the circumferential direction of the chamber 1, e.g., to form a circular cross-section for the first light source component 31. Similarly, the second light source component 32 includes a plurality of second line-light-sources. The length direction of each second line-light-source 300 is along the moving direction of the substrate container 2. The plurality of second line-light-sources are parallel to each other and arranged along the circumferential direction of the chamber 1, e.g., to form a circular cross-section for the second light source component.

Additionally, as shown in FIG. 4, the upper ends of the plurality of first line-light-sources 300 are connected to a first conductive ring 331. The lower ends of the plurality of first line-light-sources 300 are connected to a second conductive ring 332. Thus, a plurality of first line-light-sources 300 are connected in parallel by means of the first conductive ring 331 and the second conductive ring 332. That is, the first conductive ring 331 and the second conductive ring 332 may function as positive and negative common electrodes of each of the first line-light-sources 300. The electrical connection manner of the second line-light-sources is similar to the first line-light-sources 300. The upper ends of the plurality of second line-light-sources are connected to the third conductive ring, and the lower ends of the plurality of second line-light-sources are connected to the fourth conductive ring. Thus, the plurality of second line-light-sources are connected in parallel by means of the third conductive ring and the fourth conductive ring. The substrate container 2 may be moved in a space surrounded by the first line-light-sources 300 and the second line-light-sources.

Optionally, in order to make the first light source component 31 and the second light source component 32 uniformly heat in a range of 360 degrees respectively, any two adjacent first line-light-sources 300 are spaced apart by a substantially same distance, and any two adjacent second line-light-sources are spaced apart by a substantially same distance. With the first light source component 31 and the second light source component 32 as disposed above, the heating energy and temperature in the space surrounded by the first line-light-sources 300 and the second line-light-sources can be kept uniform, so that the substrate in the substrate container 2 is uniformly heated.

In one embodiment, referring back to FIG. 3, the heating component 3 further includes a first reflection tube 33 and a second reflection tube 34. The first reflection tube 33 is located between the first chamber 12 and the first light source component 31. The second reflection tube 34 is located between the second chamber 13 and the second light source component 32. The first reflection tube 33 and the second reflection tube 34 are provided for reflecting light illuminated thereon toward the substrate container 2 and the substrates in the substrate container 2. That is, the first reflection tube 33 and the second reflection tube 34 are provided for reflecting heat transferred thereto toward the substrate container 2 and the substrates in the substrate container 2. For example, the first reflection tube 33 is a cylindrical structure that is closed in the circumferential direction and is disposed around the first light source component 31 between the first light source component 31 and the first chamber 12 in the circumferential direction of the first light source component 31. The second reflection tube 34 is a cylindrical structure that is closed in the circumferential direction and is disposed around the second light source component 32 between the second light source component 32 and the second chamber 13 in the circumferential direction of the second light source component 32. The above arrangement enables that the heat generated by the first light source component 31 and the second light source component 32 can be well maintained in the tube, thereby improving the heat utilization rate of the first light source component 31 and the second light source component 32, improving the heating efficiency, and ensuring a uniform heating temperatures in the first reflection tube 33 and the second reflection tube 34, so that the substrates in the substrate container 2 can be uniformly heated.

Optionally, the first reflection tube 33 and the second reflection tube 34 are butted together, e.g., aligned and connected with each other, to form an integral body, and a first opening 30 which allows the substrates to pass through is provided at a position of the integral body corresponding to the substrate transferring opening 11. The first reflection tube 33 and the second reflection tube 34 which are butted together to form an integral body can better maintain the heating energy in the tube, thereby better improving the heat utilization rate of the first light source component 31 and the second light source component 32, improving the heating efficiency and ensuring a uniform heating temperature in the first reflection tube 33 and the second reflection tube 34, which are butted together to form an integral body. The first opening 30 corresponds to the substrate transferring opening 11 to facilitate the substrate to access the chamber 1.

In one embodiment, optionally, by polishing and/or surface-treating the inner walls of the first reflection tube 33 and the second reflection tube 34, light illuminated thereon can be diffusely reflected and/or specularly reflected. The diffuse reflection enables uniform illuminations and uniform reflections of light emitted by the first light source component 31 and the second light source component 32 in the chamber, thereby making the heating energy in the tube more uniform. The specular reflection can reflect most of lights emitted by the first light source component 31 and the second light source component 32 back into the tube including the first reflection tube 33 and the second reflection tube 34, thereby reducing the loss of heating energy and ensuring heat uniformity in the tube.

In one embodiment, the heating component 3 further includes a first reflector panel 35 and a second reflector panel 36. The first reflector panel 35 covers one end of the first reflection tube 33 away from the substrate transferring opening 11, and the second reflector panel 36 covers one end of the second reflection tube 34 away from the substrate transferring opening 11. The first reflector panel 35 and the second reflector panel 36 are provided for reflecting a light illuminated thereon to the substrate container 2 and the substrate therein. The first reflector panel 35 and the second reflector panel 36 are disposed so that the tube formed by abutting the first reflection tube 33 and the second reflection tube 34 forms a closed space. Under the reflection of the first reflector 35 and the second reflector 36, the heating energy in the closed space inside the tube can be better maintained therein, thereby improving the heat utilization rate of the first light source component 31 and the second light source component 32, and improving the heating efficiency. At the same time, the interference of external environment of the chamber 1 with the closed environment in the tube can be reduced, and the heating environment in the closed space formed in the tube can be balanced, thereby ensuring that a substrate in the closed space formed in the tube can be uniformly heated.

Optionally, by polishing and/or surface treating the wall surfaces, e.g., inner wall surfaces, of the first reflector panel 35 and the second reflector panel 36 facing each other, the light illuminated thereon can be diffusely reflected and/or specularlly reflected. The diffuse reflection enables uniform illuminations and uniform reflections of lights emitted by the first light source element 31 and the second light source component 32 in the tube formed by the first reflection tube 33 and the second reflection tube 34, thereby making the heating energy in the tube more uniform. The specular reflection enables most of lights emitted by the first light source component 31 and the second light source component 32 to be reflected back into the tube, thereby reducing the loss of heating energy and ensuring the utilization rate and balance/uniformity of heat in the tube.

In one embodiment, optionally, the first reflection tube 33, the second reflection tube 34, the first reflector panel 35 and the second reflector panel 36 may be made of stainless steel material. The stainless steel material can well conduct the heat and allow the heat inside the tube to be more uniform. Alternatively, the first reflector panel 35 and the second reflector panel 36, and the first reflector panel 35 and the second reflector panel 36 may also be made of other materials, such as ceramics and the like.

In one embodiment, as shown in FIG. 4, the first light source component 31 includes a plurality of first line-light-sources 300. The length direction of each first line-light-source 300 is along the moving direction of the substrate container 2. The plurality of first line-light-sources 300 are parallel to each other and are arranged along the circumferential direction of the chamber 1, e.g., to form a circular cross-section for the first light source component 31. Similarly, the second light source component 32 includes a plurality of second line-light-sources. The length direction of each second line-light-source is along the moving direction of the substrate container 2. The plurality of second line-light-sources are parallel to each other and are arranged along the circumferential direction of the chamber 1, e.g., to form a circular cross-section for the second light source component.

In one embodiment, as shown in FIG. 4, the upper ends of the plurality of first line-light-sources 300 are connected to the first conductive ring 331. The lower ends of the plurality of first line-light-sources 300 are connected to the second conductive ring 332. Thus, the plurality of first line-light-sources 300 are connected in parallel by means of the first conductive ring 331 and the second conductive ring 332. That is, the first conductive ring 331 and the second conductive ring 332 are used as positive and negative common electrodes of each first line-light-source 300. The electrical connection manner of the second line-light-sources is similar to that of the first line-light-sources 300. The upper ends of the plurality of second line-light-sources are connected to the third conductive ring, and the lower ends of the plurality of second line-light-sources are connected to the fourth conductive ring. Thus, the second line-light-sources are connected in parallel by means of the third conductive ring and the fourth conductive ring. That is, the third conductive ring and the fourth conductive ring are used as positive and negative common electrodes of each second line-light-source.

The substrate container 2 may be moved in a space surrounded by the first line-light-sources 300 and the second line-light-sources. Optionally, in order to enable each of the first light source component 31 and the second light source component 32 to uniformly heat in a range of 360 degrees respectively, the spacing between any two adjacent first line-light-sources 300 is substantially equally arranged, and the spacing between any two adjacent second line-light-sources is substantially equally arranged. For example, a distance between any two adjacent first line-light-sources in a direction perpendicular to the length direction of the plurality of first line-light-sources is substantially same, and a distance between any two adjacent second line-light-sources in a direction perpendicular to the length direction of the plurality of second line-light-sources is substantially same.

With the above arrangement of the first light source component 31 and the second light source component 32, the heating energy and temperature in the space surrounded by the first line-light-sources 300 and the second line-light-sources can be kept uniform, and the substrates in the substrate container 2 can be uniformly heated.

Figure 5:
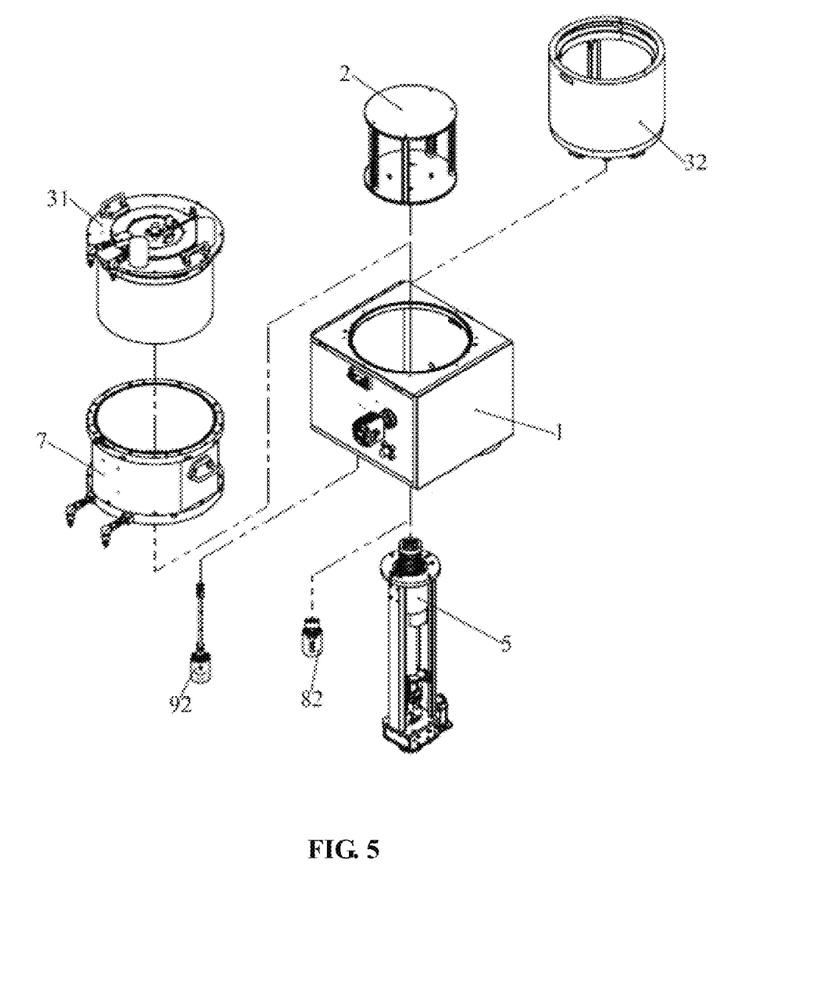
FIG. 5 is an exploded view of a degassing chamber according to some embodiments of the present disclosure.
Figure 6:
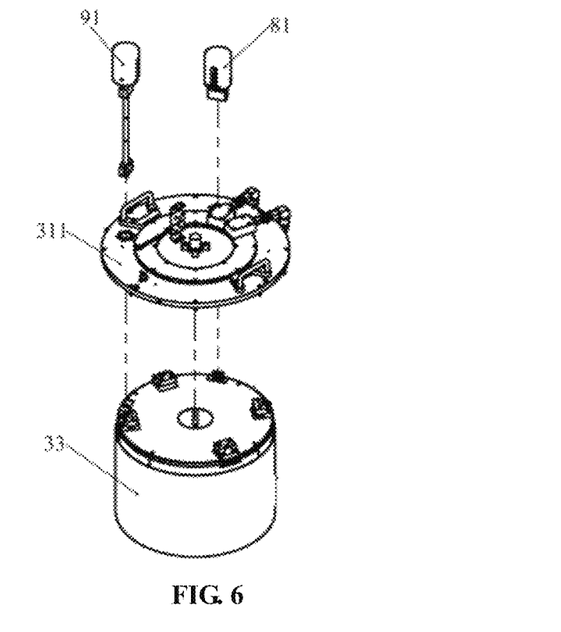
FIG. 6 is an exploded view of a first light source component according to some embodiments of the present disclosure.

In one embodiment, as shown in FIG. 5 and FIG. 6, the degassing chamber includes a chamber 1, a substrate container 2, a lifting system 5, a reflection tube 7, a first light source component 31, a second light source component 32, an upper electrical-connection short component 81, an upper electrical-connection long component 91, a lower electrical-connection short component 82, and a lower electrical-connection long component 92. The lower electrical-connection short component 82 and the lower electrical-connection long component 92 are electrically connected to the positive and negative common electrodes (e.g., the third conductive ring and the fourth conductive ring) of the second light source component 32 through the chamber 1 respectively. The electrical connection transmits an electrical signal to the second light source component 32 to illuminate the second light source component 32. The upper electrical-connection short component 81 and the upper electrical-connection long component 91 are electrically connected to the positive and negative common electrodes (the first conductive ring and the second conductive ring) of the first light source component 31 through the chamber 1 respectively. The electrical connection transmits an electrical signal to the first light source component 31 to illuminate the first light source component 31. Therefore, the first light source component 31 and the second light source component 32 can realize power supply for all the first line-light-sources 300 and the second line-light-source by only one short component for electrical connection and one long component for electrical connection respectively. The power supply structure is simple and the cost is low.

In one embodiment, as shown in FIG. 6, the first light source component 31 further includes an upper cover component 311. The upper cover component 311 is disposed at an end of the first light source component 31 (including circularly arranged the first line-light-sources 300) away from the second light source component 32. The upper cover component 311 includes two upper conductive semi-rings, an upper ceramic inner ring, and an upper ceramic outer ring. The two upper conductive semi-rings are electrically connected to the positive or negative common electrodes of the first light source component 31 and the second light source component 32, respectively. The above electrical connection of the two upper conductive semi-rings realizes the parallel connection of the first light source component 31 and the second light source component 32. That is, each of the two upper conductive semi-rings are used as one of the common electrodes of the first light source component 31 and the second light source component 32. The upper ceramic inner ring and the upper ceramic outer ring are used to wrap the two upper conductive semi-rings to insulate the two upper conductive semi-rings from the outside. Since the upper ceramic outer ring and the upper conductive semi-ring need to be disassembled when the first line-light-sources 300 in the first light source component 31 need to be replaced, the separate arrangement of the two upper conductive semi-rings facilitates the removal and installation of the first line-light-sources 300. In addition, the upper ceramic outer ring is disposed separately, that is, the upper ceramic outer ring is divided into a plurality of parts, which not only facilitates self-disassembly, but also facilitates assembly and disassembly between the first line-light-sources 300 and the upper cover component 311.

Figure 7:
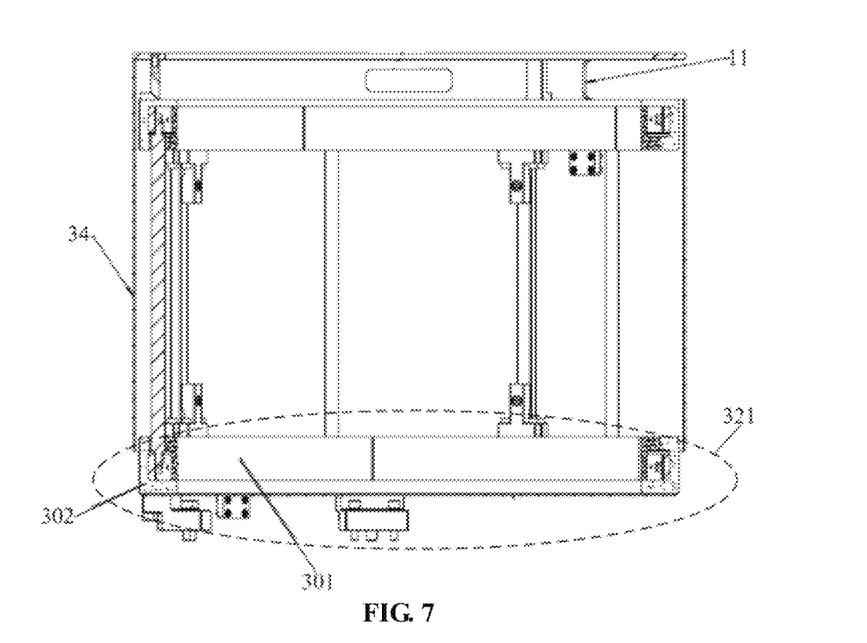
FIG. 7 is a cross-sectional view of a second light source component according to some embodiments of the present disclosure.

As shown in FIG. 7, the second light source component 32 further includes a lower cover component 321, which is disposed at an end of the second light source component 32 (including circularly arranged the second line-light-sources) away from the first light source component 31. The lower cover component 321 includes two lower conductive semi-rings, a lower ceramic inner ring 301 and a lower ceramic outer ring 302. The two lower conductive semi-rings are electrically connected to the negative or positive common electrodes of the first light source component 31 and the second light source component 32 respectively. The above electrical connection of the two lower conductive semi-rings realizes the parallel connection of the first light source component 31 and the second light source component 32. That is, each of the two lower conductive semi-rings are used as one of the common electrodes of the first light source component 31 and the second light source component 32. The lower ceramic inner ring 301 and the lower ceramic outer ring 302 are used to wrap the two lower conductive semi-rings to insulate the two lower conductive semi-rings from the outside. Since the lower ceramic inner ring 301 and the lower conductive semi-ring need to be disassembled before the second line-light-sources in the second light source component 32 are replaced, the separate disposition of the two lower conductive semi-rings facilitates the removal and installation of the second line-light-sources. In addition, the lower ceramic inner ring 301 is disposed separately, that is, the lower ceramic inner ring 301 is divided into a plurality of parts, which not only facilitates self-disassembly, but also facilitates the assembly and disassembly between the second line-light-sources and the lower cover component 321.

The upper electrical-connection short component 81 and the upper electrical-connection long component 91 are respectively connected to the upper conductive semi-ring and the lower conductive semi-ring, of the first light source component 31. Therefore, the current flowing through the first line-light-sources forms a loop, thereby implementing the power supply to the first line-light-sources. The lower electrical-connection short component 82 and the lower electrical-connection long component 92 are respectively connected to the lower conductive semi-ring and the upper conductive semi-ring, of the second light source component 32. Therefore, the current flowing through the second line-light-sources forms a loop, thereby implementing the power supply to the second line-light-sources.

As such, the disclosed degassing chamber, by disposing a first light source component and a second light source component respectively in a first chamber and a second chamber divided by a substrate transferring opening, enables a substrate in a substrate container to be heated by light sources in the upper region and/or in the lower region of the substrate transferring opening, thereby ensuring a uniform process temperature of the substrates during a degassing process and a transferring process. In addition, not only the quality of the substrate degassing process is improved, but also cleaner substrates for the subsequent process are provided.

Various embodiments also provide a semiconductor processing apparatus including the disclosed degassing chamber. As such, the processing quality of the semiconductor processing apparatus is improved.

For example, the semiconductor processing apparatus may include a physical vapor deposition (PVD) device and a degassing chamber used for a degas process to remove impurities, such as water vapor and the like adsorbed by the substrate from the atmosphere, to clean the surface of the substrate, and to provide a clean substrate for subsequent processes.

It can be understood that the above embodiments are merely exemplary embodiments adopted to explain the principles of the disclosure, but the disclosure is not limited to thereto. Various modifications and improvements can be made by those skilled in the art without departing from the spirit and scope of the disclosure, and such modifications and improvements are also considered as the scope of the resent disclosure.

What is claimed is:

1. A degassing chamber, comprising:
a chamber;
a substrate container, movable within the chamber in a vertical direction; and
a heating component, disposed within the chamber, wherein:
   a substrate transferring opening is formed through a sidewall of the chamber for transferring substrates into or out of the chamber;
   the heating component includes a first light source component and a second light source component;
   the chamber is divided into a first chamber and a second chamber by the substrate transferring opening;
   the first light source component includes a plurality of first line-light-sources configured surrounding the substrate container, a first conductive ring connecting to ends of the plurality of first line-light-sources, and a second conductive ring connecting to another ends of the plurality of first line-light-sources, wherein the plurality of first line-light-sources, the first conductive ring, and the second conductive ring are located in the first chamber;
   the second light source component is located in the second chamber; and
   the first light source component and the second light source component are provided for heating a substrate in the substrate container.

2. The degassing chamber according to claim 1, wherein:
the first light source component is disposed in an inner side of a sidewall of the first chamber and surrounding the first chamber along a circumferential direction of the first chamber;
the second light source component is disposed in an inner side of a sidewall of the second chamber and surrounding the second chamber along a circumferential direction of the second chamber; and
the substrate container is movable in a space surrounded by the first and second light source components.

3. The degassing chamber according to claim 1, wherein:
a length direction of each first line-light-source is parallel to a moving direction of the substrate container, and the plurality of first line-light-sources are parallel to each other and arranged having a circular cross-section; and
the second light source component comprises a plurality of second line-light-sources, a length direction of each second line-light-source is parallel to the moving direction of the substrate container, and the plurality of second line-light-sources are parallel to each other and arranged having a circular cross-section.

4. The degassing chamber according to claim 3, wherein:
a distance between any two adjacent first line-light-sources in a direction perpendicular to the length direction of the plurality of first line-light-sources is substantially same; and
a distance between any two adjacent second line-light-sources in a direction perpendicular to the length direction of the plurality of second line-light-sources is substantially same.

5. A degassing chamber, comprising:
a chamber;
a substrate container, movable within the chamber in a vertical direction; and
a heating component, disposed within the chamber, wherein:
   a substrate transferring opening is formed through a sidewall of the chamber for transferring substrates into or out of the chamber;
   the heating component includes a first light source component and a second light source component;
   the chamber is divided into a first chamber and a second chamber by the substrate transferring opening;
   the first light source component is located in the first chamber, and the second light source component is located in the second chamber; and
   the first light source component and the second light source component are provided for heating a substrate in the substrate container,
wherein:
the heating component further includes a first reflection tube and a second reflection tube;
the first reflection tube is located between the first chamber and the first light source component; and the second reflection tube is located between the second chamber and the second light source component; and
the first reflection tube and the second reflection tube are provided for reflecting light illuminated thereon to the substrate in the substrate container.

6. The degassing chamber according to claim 5, wherein:
the first reflection tube and the second reflection tube are butted together to form an integral body; and a first opening is provided in a sidewall of the integral body at a position corresponding to the substrate transferring opening for transferring the substrate.

7. The degassing chamber according to claim 6, wherein:
the heating component further includes a first reflector panel and a second reflector panel;
the first reflector panel covers an end of the first reflection tube away from the substrate transferring opening;
the second reflector panel covers an end of the second reflection tube away from the substrate transferring opening; and
the first reflector panel and the second reflector panel are provided for reflecting light illuminated thereon to the substrate in the substrate container.

8. The degassing chamber according to claim 6, wherein:
inner walls of the first reflection tube and the second reflection tube enable diffuse reflection and/or specular reflection of light illuminated thereon.

9. The degassing chamber according to claim 7, wherein:
an inner wall of the first reflector panel facing the first reflection tube and an inner wall of the second reflector panel facing the second reflection tube enable diffuse reflection and/or specular reflection of light illuminated thereon.

10. The degassing chamber according to claim 5, wherein the first reflection tube and the second reflection tube are made of stainless steel.

11. The degassing chamber according to claim 7, wherein:
the first reflector panel and the second reflector panel are made of stainless steel.

12. The degassing chamber according to claim 2, wherein:
the heating component further includes a first reflection tube and a second reflection tube;
the first reflection tube is located between the first chamber and the first light source component; and
the second reflection tube is located between the second chamber and the second light source component; and
the first reflection tube and the second reflection tube are provided for reflecting light illuminated thereon to the substrate in the substrate container.

13. The degassing chamber according to claim 3, wherein:
the heating component further includes a first reflection tube and a second reflection tube;
the first reflection tube is located between the first chamber and the first light source component; and
the second reflection tube is located between the second chamber and the second light source component; and
the first reflection tube and the second reflection tube are provided for reflecting light illuminated thereon to the substrate in the substrate container.

14. The degassing chamber according to claim 4, wherein:
the heating component further includes a first reflection tube and a second reflection tube;
the first reflection tube is located between the first chamber and the first light source component; and
the second reflection tube is located between the second chamber and the second light source component; and
the first reflection tube and the second reflection tube are provided for reflecting light illuminated thereon to the substrate in the substrate container.

15. A semiconductor processing apparatus, comprising:
a degassing chamber, comprising:
a chamber;
a substrate container, movable within the chamber in a vertical direction; and
a heating component, disposed within the chamber, wherein:
a substrate transferring opening is formed through a sidewall of the chamber for transferring substrates into or out of the chamber;
the heating component includes a first light source component and a second light source component;
the chamber is divided into a first chamber and a second chamber by the substrate transferring opening;
the first light source component is located in the first chamber, and the second light source component is located in the second chamber;
the first light source component and the second light source component are provided for heating a substrate in the substrate container; and
the heating component further includes a first reflection tube and a second reflection tube, the first reflection tube is located between the first chamber and the first light source component, the second reflection tube is located between the second chamber and the second light source component, and the first reflection tube and the second reflection tube are provided for reflecting light illuminated thereon to the substrate in the substrate container.

16. The degassing chamber according to claim 1, wherein the second light source component is structurally different than the first light source component and the second light source component comprises:
a plurality of second line-light-sources configured surrounding the substrate container,
a third conductive ring connecting to ends of the plurality of second line-light-sources, and
a fourth conductive ring connecting to another ends of the plurality of second line-light-sources, wherein the plurality of second line-light-sources, the third conductive ring, and the fourth conductive ring are located in the second chamber.

* * * * *